United States Patent
Guo et al.

(10) Patent No.: US 12,543,377 B2
(45) Date of Patent: Feb. 3, 2026

(54) ULTRAVIOLET LAMP BEAD PACKAGE STRUCTURE AND PREPARATION METHOD THEREOF

(71) Applicant: Novoshine Semiconductor Technology(Wuxi) Co., Ltd., Wuxi (CN)

(72) Inventors: Wenping Guo, Wuxi (CN); Qunxiong Deng, Wuxi (CN); Kui Han, Wuxi (CN)

(73) Assignee: Novoshine Semiconductor Technology(Wuxi) Co., Ltd., Wuxi (CN)

( * ) Notice: Subject to any disclaimer, the term of this patent is extended or adjusted under 35 U.S.C. 154(b) by 426 days.

(21) Appl. No.: 18/170,054

(22) Filed: Feb. 16, 2023

(65) Prior Publication Data
US 2023/0197708 A1    Jun. 22, 2023

Related U.S. Application Data

(63) Continuation of application No. PCT/CN2022/138986, filed on Dec. 14, 2022.

(30) Foreign Application Priority Data

Feb. 10, 2022  (CN) .......................... 202210125173.0

(51) Int. Cl.
*H10D 89/60* (2025.01)
*H10H 20/01* (2025.01)
(Continued)

(52) U.S. Cl.
CPC ........... *H10D 89/611* (2025.01); *H10H 20/01* (2025.01); *H10H 20/832* (2025.01);
(Continued)

(58) Field of Classification Search
CPC .. H10H 20/855; H10H 20/857; H10D 89/611; H01L 25/167
(Continued)

(56) References Cited

U.S. PATENT DOCUMENTS

2008/0006837 A1 * 1/2008 Park .................. H10H 20/8506
                                                 257/E33.072
2012/0241806 A1   9/2012 Kim et al.
(Continued)

FOREIGN PATENT DOCUMENTS

CN       201556617 U    8/2010
CN       201829538 U    5/2011
(Continued)

*Primary Examiner* — Eliseo Ramos Feliciano
*Assistant Examiner* — Mikka Liu
(74) *Attorney, Agent, or Firm* — IPRO, PLLC; Na Xu

(57) ABSTRACT

The disclosure discloses an ultraviolet lamp bead package structure and a preparation method thereof. The ultraviolet lamp bead package structure includes a substrate and a first metal layer arranged on each of a package surface and a back surface of the substrate. A Zener chip is arranged on the electrode region of the first metal layer. The first metal layer also has a peripheral region. A second metal layer is arranged on the first metal layer. An Ultra Violet C radiation (UVC) chip is arranged on the electrode region of the second metal layer. The second metal layer is provided with a quartz lens by sealing through the peripheral region of the second metal layer. The quartz lens wraps the UVC chip and the Zener chip. An filler with anti-UVC characteristic is filled between the quartz lens and each of the UVC chip and the Zener chip.

4 Claims, 8 Drawing Sheets

(51) Int. Cl.
  *H10H 20/832* (2025.01)
  *H10H 20/84* (2025.01)
  *H10H 20/855* (2025.01)
  *H10H 20/857* (2025.01)

(52) U.S. Cl.
  CPC .......... H10H 20/84 (2025.01); H10H 20/855 (2025.01); H10H 20/857 (2025.01)

(58) Field of Classification Search
  USPC .................................................. 257/98–100
  See application file for complete search history.

(56) References Cited

U.S. PATENT DOCUMENTS

2015/0194585 A1    7/2015    Kim et al.
2022/0190208 A1*    6/2022    Miller .................. H10H 20/841
2022/0328729 A1*    10/2022    Lunev .................. H10H 20/855

FOREIGN PATENT DOCUMENTS

| | | |
|---|---|---|
| CN | 106981555 A | 7/2017 |
| CN | 207719231 U | 8/2018 |
| CN | 109742212 A | 5/2019 |
| CN | 111934193 A | 11/2020 |
| CN | 112563255 A | 3/2021 |
| CN | 212907789 U | 4/2021 |
| CN | 213242589 U | 5/2021 |
| CN | 213546349 U | 6/2021 |
| CN | 113594323 A | 11/2021 |
| CN | 115207184 A | 10/2022 |
| JP | 2012015438 A | 1/2012 |
| KR | 20090044306 A | 5/2009 |
| KR | 20110126432 A | 11/2011 |

* cited by examiner

ULTRAVIOLET LAMP BEAD PACKAGE STRUCTURE AND PREPARATION METHOD THEREOF

TECHNICAL FIELD

The disclosure relates to an ultraviolet lamp bead package structure and a preparation method thereof, and belongs to the technical field of Light Emitting Diode (LED) package.

BACKGROUND

Ultra Violet C radiation (UVC) refers to short-wave ultraviolet, and UVC light source is often used in medical treatment, pharmacy, and other fields. At present, UVC LED packaging methods are divided into organic packaging, semi-inorganic packaging, and fully inorganic packaging. Organic packaging uses organic materials such as silica gel, silicon resin, or epoxy resin. Fully inorganic packaging avoids the use of organic material in the whole process, and implements bonding of a lens and a substrate by laser welding, wave soldering, resistance welding, etc. Semi-inorganic packaging combines an organic silicon material and an inorganic material such as glass, and mainly is composed of a ceramic substrate, a chip, a bracket, and quartz glass, where the chip is disposed on the ceramic substrate, positive and negative electrodes of the chip are connected with the bracket through a line, and an upper end of the bracket is coated with organic glue and then connected with the quartz glass. Package products obtained by semi-inorganic packaging are still the mainstream of the domestic market.

At present, there are usually two types of UVC package structures. In one type of UVC package structure, the substrate is commonly sealed with a metal dam, such as a UVC package structure of an LED lamp and a preparation method thereof disclosed in patent No. 201910079039.X and a UVC package structure of an LED lamp disclosed in patent No. 202022569493.4. In such a package structure, the metal dam may lead to absorption of light and reduce the light packaging efficiency, and the light efficiency may be reduced by over 30%. In addition, the cavity between the chip and the quartz glass is filled with air, and its refractive index to visible light and ultraviolet light is about 1, there is a high total reflection loss of the light from a light emitting body sapphire (n=1.82) of the chip to the cavity, and the light of the chip cannot be extracted; while a refractive index of the light of the cavity transmitted to the outside world through a high-transmittance cover plate is 1, and there is another light loss. Therefore, the structure with the cavity seriously affects the extraction efficiency of the light of the chip during packaging, namely the packaging light extraction efficiency is extremely low. In another type of UVC package structure, high-transmittance anti-UVC glue is directly used for packaging. Such a package structure has a certain advantage in packaging light extraction efficiency, but cannot implement effective water-oxygen isolation, and has the problem of poor air tightness. In addition, the UVC chip is relatively expensive, but the current UVC package structure is poor in anti-static property, no over-voltage protection, short in service life, and high in use cost.

Therefore, developing a novel ultraviolet lamp bead package structure and a preparation method thereof not only is of urgent research value but also has good economic benefits and industrial application potential, which is the motive force and basis of the disclosure to be implemented.

SUMMARY

In order to overcome the above-mentioned shortcomings of the related art, the inventor made in-depth researches and a lot of creative efforts, thereby implementing the disclosure.

Specifically, The technical problem to be solved by the disclosure is to provide an ultraviolet lamp bead package structure and a preparation method thereof to solve the problem of light absorption or poor air tightness of a current UVC package structure as well as the technical problems of low light packaging efficiency, poor anti-static property, and no over-voltage protection.

In order to solve the foregoing technical problem, the following technical solutions are used in the disclosure.

Disclosed is an ultraviolet lamp bead package structure, including a substrate. Where a first metal layer is arranged on each of a package surface and a back surface of the substrate. Electrode regions of the first metal layers on the two surfaces are connected. A Zener chip or Transient Voltage Suppressor (TVS) chip is arranged on the electrode region of the first metal layer on the package surface. The first metal layer on the package surface also has a peripheral region surrounding the electrode region of the first metal layer. A second metal layer is arranged on the first metal layer in each region. A height of an electrode region of the second metal layer is greater than or equal to those of a peripheral region of the second metal layer and the Zener chip or the TVS chip. A UVC chip is arranged on the electrode region of the second metal layer.

The second metal layer is provided with a quartz lens by sealing through the peripheral region of the second metal layer. The quartz lens is provided with an accommodating groove wrapping the UVC chip and the Zener chip or TVS chip. A filler with anti-UVC characteristic is filled between the quartz lens and each of the UVC chip and the Zener chip or TVS chip.

As an improved technical solution, the substrate is an aluminum nitride ceramic substrate.

As an improved technical solution, each of the first metal layer and the second metal layer is of a Ni—Cu—Ni—Au multilayer structure.

As an improved technical solution, each of two end portions of the substrate is provided with a through hole. The electrode region of each of the first metal layer and the second metal layer includes a P electrode region and an N electrode region. The P electrode region and the N electrode region on the back surface of the substrate are arranged at the two end portions of the substrate respectively. A heat dissipation region is further arranged between the P electrode region and the N electrode region on the back surface of the substrate.

The P electrode regions of the first metal layers on the package surface and the back surface of the substrate are connected by the through hole. The N electrode regions of the first metal layers on the package surface and the back surface of the substrate are connected by the through hole.

As an improved technical solution, each region of the second metal layer is the same in thickness, and a thickness of the second metal layer is greater than that of the Zener chip or the TVS chip.

As an improved technical solution, the P electrode region of the first metal layer on the package surface of the substrate is provided with an electrode identification notch.

As an improved technical solution, a solder mask layer is arranged between each of the P electrode region and the N electrode region on the back surface of the substrate and the heat dissipation region.

As an improved technical solution, the Zener chip or the TVS chip is fixedly mounted on the first metal layer by a AuSn alloy welding process, solder paste, or glue with conductive particles, and positive and negative electrodes of the Zener chip or the TVS chip are connected with the P electrode region and the N electrode region of the first metal layer respectively.

The UVC chip is fixedly mounted on the second metal layer by a AuSn alloy welding process, solder paste, or glue with conductive particles, and positive and negative electrodes of the UVC chip are connected with the P electrode region and the N electrode region of the second metal layer respectively.

As an improved technical solution, the peripheral region of the second metal layer is of a hollow-square-shaped structure with a glue collection groove, and the quartz lens is fixedly mounted on the second metal layer by sealing through a glue solution containing at least one of silicon resin, epoxy resin, polyacrylate, polyamide, and benzocyclobutene.

As an improved technical solution, the quartz lens includes a base mounting portion and a light shape modification portion, and is fixedly mounted on the second metal layer through the base mounting portion of the quartz lens.

As an improved technical solution, the filler contains at least one of silica gel, epoxy resin, silicone, fluorine resin, a molded glass solution, and an organic glass solution.

The disclosure also discloses a preparation method for an ultraviolet lamp bead package structure, the method includes the following steps:

S1: providing a substrate, and providing through holes in the substrate to obtain a structure I;

S2: preparing a first metal layer on each of two surfaces of the structure I, the surface with a peripheral region is a package surface and the surface with a heat dissipation region is a back surface, and connecting electrode regions of the first metal layers on the package surface and the back surface to obtain a structure II;

S3: preparing a second metal layer on the first metal layer on each of the two surfaces of the substrate to obtain a structure III;

S4: preparing a solder mask layer between the electrode region and the heat dissipation region on the back surface of the structure III to obtain a structure IV;

S5: fixedly connecting a Zener chip or TVS chip to the electrode region of the first metal layer on the package surface, and fixedly connecting a UVC chip to an electrode region of the second metal layer on the package surface to obtain a structure V;

S6: coating a peripheral region of the second metal layer with a glue solution and preliminarily semi-curing the glue solution to obtain a structure VI, and simultaneously providing a quartz lens with an accommodating groove and adding a filler with anti-UVC characteristic into the accommodating groove of the quartz lens to obtain a structure VII; and S7: disposing the structure VI on the structure VII upside down, and performing lamination and curing to obtain a final package product.

As an improved technical solution, the preparing a first metal layer on each of two surfaces of the structure I in step S2 includes:

forming a photoresist layer on one surface of the structure I, patterning the photoresist layer by exposure and development processes, and then plating the surface of the substrate with the patterned photoresist layer with a metal layer by evaporation or electroplating;

forming a patterned photoresist layer on the other surface of the structure I in the same manner, and then plating the surface with a metal layer to obtain a structure whose both surfaces are plated with metal layers, electrode regions of the metal layers on the two surfaces being connected by the through holes; and performing photoresist stripping by a photoresist stripping process to remove the photoresist layers to obtain the structure II.

As an improved technical solution, in step S5, the Zener chip or the TVS chip is disposed on the electrode region of the first metal layer on the package surface, the UVC chip is disposed on the electrode region of the second metal layer on the package surface, then eutectic welding of the chips on the metal layers is performed by a AuSn alloy welding process to implement fixation of the chips on the metal layers, and positive and negative electrodes of the chips are connected with the metal layers.

As an improved technical solution, in step S6, a top surface of an outer circle of the peripheral region of the second metal layer is coated with a glue solution containing at least one of silicon resin, epoxy resin, polyacrylate, polyamide, and benzocyclobutene, and then the glue solution is preliminarily semi-cured.

The quartz lens is disposed with the accommodating groove upward, and then the accommodating groove of the quartz lens is additionally filled with a filler containing at least one of silica gel, epoxy resin, silicone, fluorine resin, a molded glass solution, and an organic glass solution.

With adoption of the above-mentioned technical solutions, the disclosure has the following beneficial effects.

(1) The ultraviolet lamp bead package structure has no dam that blocks light of the UVC chip, so that light absorption is avoided during work of the package structure, and the light packaging efficiency is improved greatly. In addition, the Zener chip or the TVS chip connected in parallel with the UVC chip implements over-voltage protection without blocking the light of the UVC chip, also improves the electrostatic breakdown resistance of the package structure greatly, and prolongs the service life of the UVC chip. Moreover, the package structure uses the high-transmittance quartz lens as a seal, so that the air tightness of a lamp bead is improved, water-oxygen isolation is implemented effectively, and a light shape may be modified. The filler with anti-UVC characteristic is filled between the quartz lens and each of the UVC chip and the Zener chip or the TVS chip, whose refractive index is numerically between a light emitting body sapphire (n=1.82) of the chip and the quartz lens (n=1.492), so that the total reflection loss of the light in propagation is reduced, and the light extraction efficiency is improved.

(2) In the package structure, the positive and negative electrodes of the UVC chip and the Zener chip or the TVS chip are transferred to the back surface of the substrate, so that surface mounting for use may be implemented, and the ultraviolet lamp bead package structure may be mounted on a solder pad more conveniently, occupied volume is smaller.

(3) The heat dissipation region arranged on the back surface of the package structure implements thermoelectric separation, so that a heat dissipation effect of a packaged chip is improved greatly, and the performance and service life of the packaged chip are further improved.

(4) The first metal layer on the package surface of the substrate is provided with the electrode identification notch, so that the positive and negative electrodes may be distinguished conveniently when the package structure is mounted and used.

(5) The solder mask layer arranged on the back surface of the substrate may avoid the metal layers in the heat dissipation region being connected together when the package structure is fixedly welded to the solder pad, making it convenient to mount the package structure accurately.

(6) The peripheral region of the second metal layer is of the hollow-square-shaped structure with the glue collection groove, and when the part of the substrate coated with the semi-cured glue solution is disposed on the quartz lens upside down for lamination, the surplus glue solution may spill into the glue collection groove, so that the glue solution is prevented from spilling into the package structure, avoiding the influence on the packaged chip and greatly improving the mounting firmness and the air tightness of the quartz lens.

(7) The filler is filled between the quartz lens and the chip, so that the light extraction efficiency is improved, and in addition, relatively high anti-UVC characteristic and long service life are ensured.

BRIEF DESCRIPTION OF FIGURES

In order to describe the technical solutions in specific implementations of the disclosure or the related art more clearly, the drawings required to be used in descriptions about the specific implementations or the related art will now be introduced briefly. Similar components or parts in all of the drawings are generally marked with similar reference signs. In the drawings, each component or part is not necessarily drawn according to an actual scale.

Figure 1:
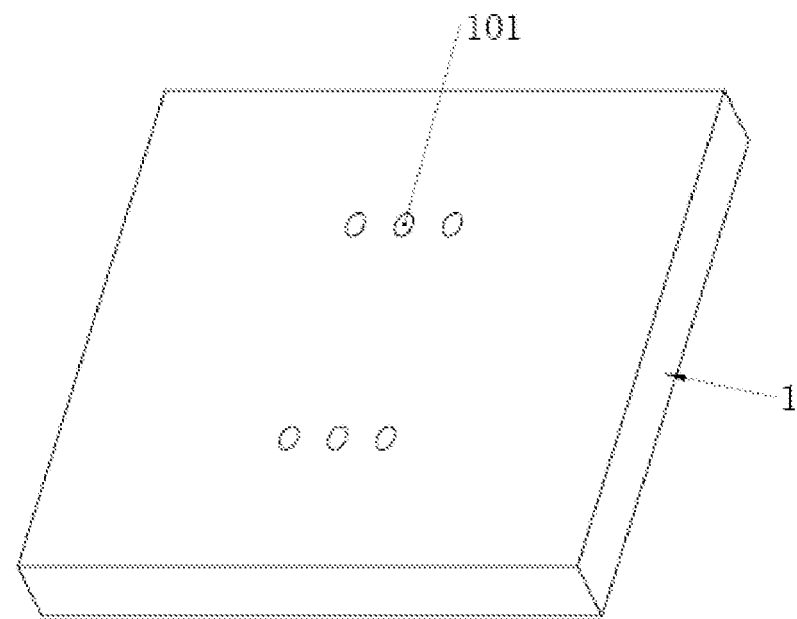
FIG. 1 is a schematic structural diagram of a structure I according to the disclosure.

The reference signs: 1—substrate; 101—through hole; 2—first metal layer; 201—electrode identification notch; 3—second metal layer; 301—glue collection groove; 4—solder mask layer; 5—Zener chip; 6—UVC chip; 7—glue solution; 8—quartz lens; 801—accommodating groove; 802—base mounting portion; 803—light shape modification portion; and 9—filler.

DETAILED DESCRIPTION

The disclosure will further be described below in combination with specific embodiments. However, these exemplary implementations are only used to illustrate the disclosure and not intended to form any limitation of any form on the actual scope of protection of the disclosure and further limit the scope of protection of the disclosure.

Embodiment 1

As shown in FIGS. 1 to 15, the present embodiment provides an ultraviolet lamp bead package structure, including a substrate 1. A first metal layer 2 is arranged on each of a package surface and a back surface of the substrate 1. Electrode regions of the first metal layers 2 on the two surfaces are connected. A Zener chip 5 is arranged on the electrode region of the first metal layer 2 on the package surface. The first metal layer 2 on the package surface also has a peripheral region surrounding the electrode region of the first metal layer. A second metal layer 3 is arranged on the first metal layer 2 in each region. A height of an electrode region of the second metal layer 3 is greater than or equal to those of a peripheral region of the second metal layer and the Zener chip 5. A UVC chip 6 is arranged on the electrode region of the second metal layer 3. The second metal layer 3 is provided with a quartz lens 8 by sealing through the peripheral region of the second metal layer. The quartz lens 8 is provided with an accommodating groove 801 wrapping the UVC chip 6 and the Zener chip 5. An filler 9 with anti-UVC characteristic is filled between the quartz lens 8 and each of the UVC chip 6 and the Zener chip 5.

In the present embodiment, the substrate 1 is made from an insulating material with high thermal conductivity, which may use one of aluminum nitride, silicon carbide, silicon, and alumina. In the present embodiment, the substrate 1 is preferably an aluminum nitride ceramic substrate with the performance of high thermal conductivity, reliable insulating property, high chemical stability and thermal stability, etc.

In the present embodiment, each of the first metal layer 2 and the second metal layer 3 is of a Ni—Cu—Ni—Au multilayer structure.

In the present embodiment, each of two end portions of the substrate 1 is provided with a through hole 101. The electrode region of each of the first metal layer 2 and the second metal layer 3 includes a P electrode region and an N electrode region. The P electrode region and the N electrode region on the back surface of the substrate 1 are arranged at the two end portions of the substrate respectively. A heat dissipation region is further arranged between the P electrode region and the N electrode region on the back surface of the substrate 1. The P electrode regions of the first metal layers 2 on the package surface and back surface of the substrate 1 are connected by the through hole 101. The N electrode regions of the first metal layers 2 on the package surface and back surface of the substrate 1 are connected by the through hole 101.

In the present embodiment, each region of the second metal layer 3 is the same in thickness, and a thickness of the second metal layer 3 is greater than that of the Zener chip 5. Therefore, no light may be blocked after the UVC chip 6 is mounted.

In the present embodiment, taking a substrate of a length of 3.8 mm, a width of 3.8 mm, and a thickness of 0.5 mm as an example, a diameter of the through hole 101 is 60 to 100 μm, preferably 80 μm; a thickness of the first metal layer 2 is 50 to 70 μm, preferably 60 μm; the thickness of the second metal layer 3 is 110 to 130 μm, preferably 120 μm; and a distance between the P electrode region and the N electrode region on the same surface of the substrate is 90 to 110 μm, preferably 100 μm.

In the present embodiment, the UVC chip 6 is a flip chip whose length and width are both 1 mm, and its wave band is 200 to 295 nm.

Figure 4:
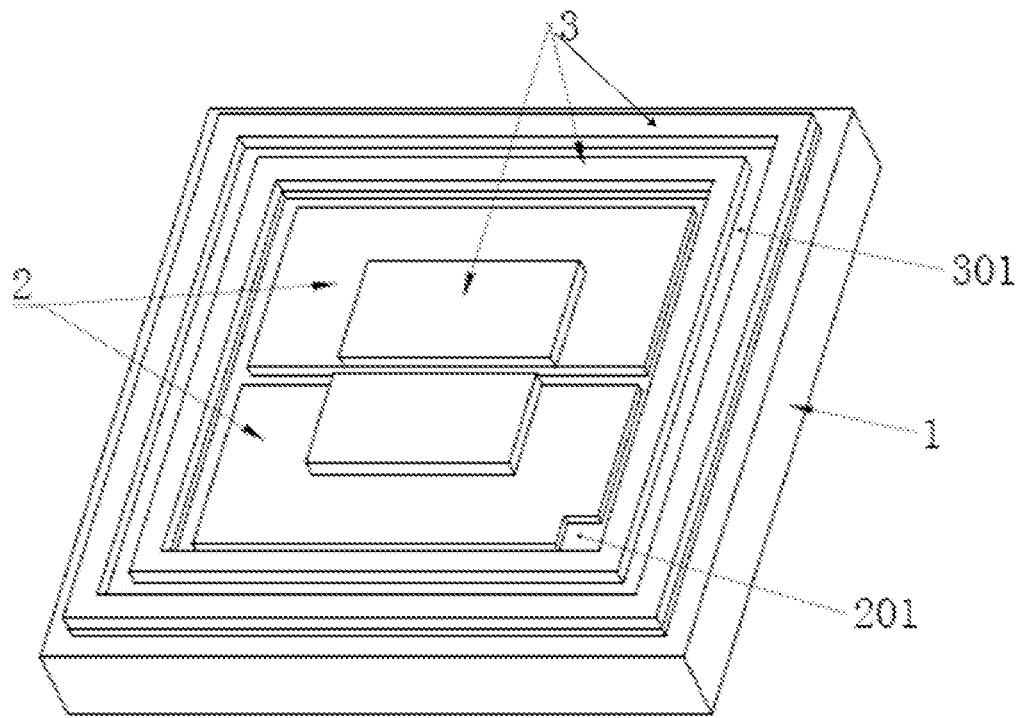
FIG. 4 is a schematic structural diagram of a structure III according to the disclosure.

In the present embodiment, the P electrode region of the first metal layer 2 on the package surface of the substrate 1 is provided with an electrode identification notch 201, so that positive and negative electrodes may be distinguished conveniently when the package structure is mounted and used, as shown in FIG. 4.

Figure 6:
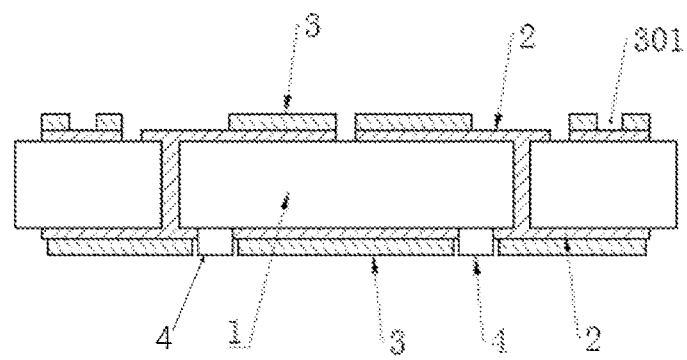
FIG. 6 is a schematic structural diagram of a structure IV according to the disclosure.

In the present embodiment, a solder mask layer 4 is arranged between each of the P electrode region and the N electrode region on the back surface of the substrate 1 and the heat dissipation region. The solder mask layer 4 may avoid the metal layers in the heat dissipation region being connected together when the package structure is fixedly welded to a solder pad, making it convenient to mount the package structure accurately. As shown in FIG. 6, the heat dissipation region is between the two solder mask layers 4, and the P electrode region and the N electrode region are on the two sides respectively.

In the present embodiment, the Zener chip 5 is fixedly mounted on the first metal layer by a AuSn alloy welding process, and positive and negative electrodes of the Zener chip 5 are connected with the P electrode region and the N electrode region of the first metal layer 2 respectively. The UVC chip 6 is fixedly mounted on the second metal layer 3 by a AuSn alloy welding process, and positive and negative electrodes of the UVC chip 6 are connected with the P electrode region and the N electrode region of the second metal layer 3 respectively.

In the present embodiment, the peripheral region of the second metal layer 3 is of a hollow-square-shaped structure with a glue collection groove 301, including an inner-circle metal and an outer-circle metal. The glue collection groove 301 is between the inner-circle and the outer-circle metals. The quartz lens 8 is fixedly mounted on the second metal layer 3 by sealing through a glue solution 7 containing at least one of silicon resin, epoxy resin, polyacrylate, polyamide, and benzocyclobutene. Due to the hollow-square-shaped peripheral region of the second metal layer 3, the surplus glue solution 7 may spill into the glue collection groove 301 when the part of the substrate coated with the semi-cured glue solution is disposed on the quartz lens 8 upside down for lamination. Therefore, the glue solution 7 is prevented from spilling into the package structure, avoiding the influence on the packaged chip and greatly improving the mounting firmness and the air tightness of the quartz lens 8.

Figure 11:
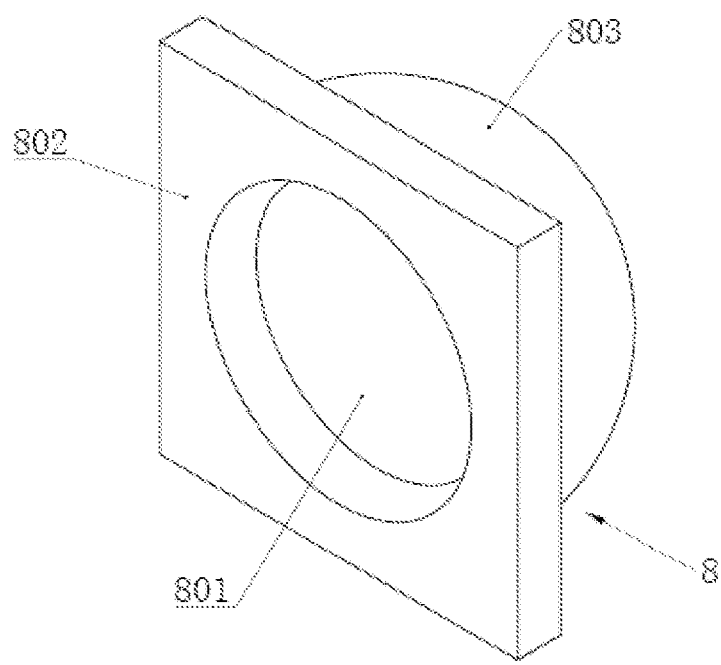
FIG. 11 is a schematic structural diagram of a quartz lens according to the disclosure.

In the present embodiment, as shown in FIG. 11, the quartz lens 8 includes a base mounting portion 802 and a light shape modification portion 803. The base mounting portion 802 is adapted to an outline dimension of the peripheral region of the second metal layer 3. The quartz lens 8 is fixedly mounted on the second metal layer 3 through the base mounting portion 802 of the quartz lens. In the present embodiment, the light shape modification portion 803 of the quartz lens 8 is of a hemispherical structure, and has a good light shape modification effect.

In the present embodiment, the accommodating groove 801 of the quartz lens 8 is of a circular-truncated-cone-shaped structure, and a distance between a bottom surface of the accommodating groove 801 and the UVC chip 6 is 5 to 20 μm.

In the present embodiment, the filler 9 contains at least one of silica gel, epoxy resin, silicone, fluorine resin, a molded glass solution, and an organic glass solution. The filler has a relatively high anti-UVC characteristic and long service life, and improves the light extraction efficiency.

The present embodiment also provides a preparation method for the ultraviolet lamp bead package structure, the method includes the following steps.

In S1, a substrate 1 is provided, and through holes 101 are provided in the substrate 1 to obtain a structure I, as shown in FIG. 1.

In this step, a device for holing the substrate 1 and a holing process are known to those skilled in the art, and will not be elaborated herein.

Figure 2:
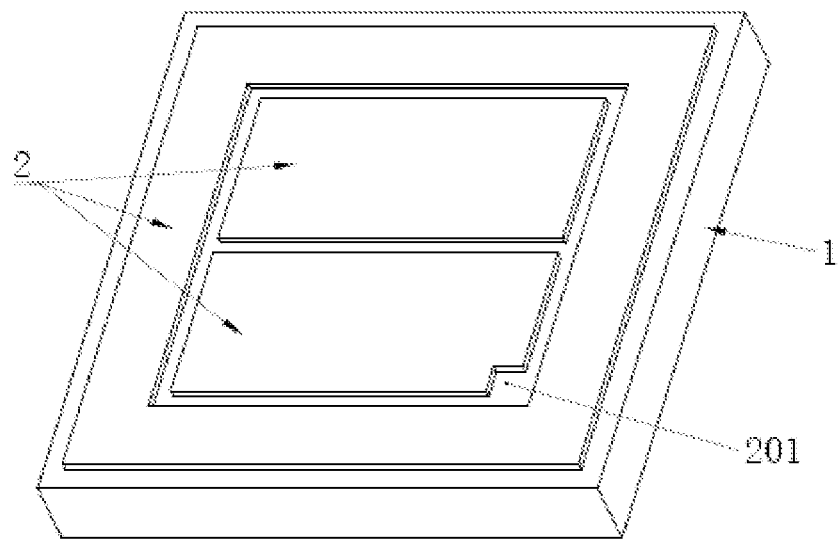
FIG. 2 is a schematic structural diagram of a structure II according to the disclosure.
Figure 3:
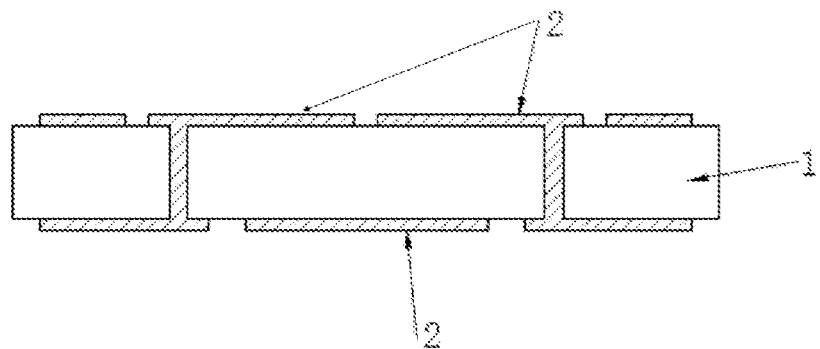
FIG. 3 is a schematic sectional structural diagram of a structure II according to the disclosure.

In S2, a first metal layer 2 is prepared on each of two surfaces of the structure I, the surface with a peripheral region is a package surface and the surface with a heat dissipation region is a back surface, and electrode regions of the first metal layers 2 on the package surface and the back surface are connected to obtain a structure II, as shown in FIGS. 2 and 3.

In this step, a photoresist layer is formed on one surface of the structure I, the photoresist layer is patterned by exposure and development processes, and then the surface of the substrate 1 with the patterned photoresist layer is plated with a metal layer by evaporation or electroplating.

Then, a patterned photoresist layer is formed on the other surface of the structure I in the same manner, and then the surface is plated with a metal layer to obtain a structure whose both surfaces are plated with metal layers. When the two surfaces of the structure I are plated with the metal layers, plated metals may be filled into the through holes 101 to connect electrode regions of the metal layers on the two surfaces by the through holes 101, as shown in FIG. 3.

Finally, photoresist stripping is performed by a photoresist stripping process to remove the photoresist layers. In photoresist stripping, the metal layers that the photoresist layers are plated with may be removed by photoresist stripping, with the first metal layers 2 that the substrate is plated with remaining.

Figure 5:
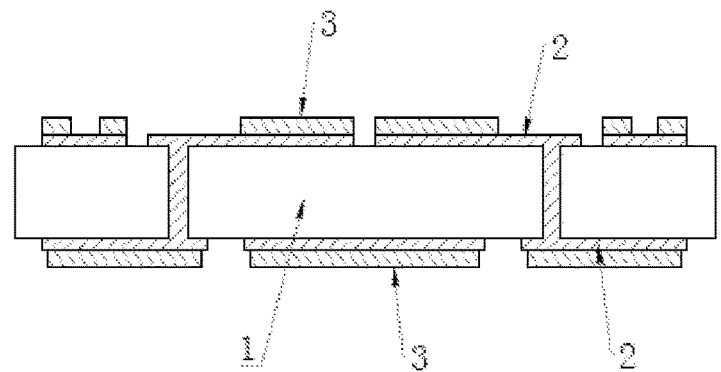
FIG. 5 is a schematic sectional structural diagram of a structure III according to the disclosure.

In S3, a second metal layer 3 is prepared on the first metal layer 2 on each of the two surfaces of the substrate 1 to obtain a structure III, as shown in FIGS. 4 and 5.

In this step, a preparation process for the second metal layer 3 is the same as that for the first metal layer 2 in step 2. Specifically, a metal layer is first prepared on one surface by a photoresist patterning process and an evaporation or electroplating process, then a metal layer is prepared on the other surface by the photoresist patterning process and the evaporation or the electroplating process, and after the two metal layers are prepared, the second metal layer 3 is finally prepared by the photoresist stripping process. A thickness of the second metal layer 3 is greater than that of the first metal layer 2, and a peripheral region of the second metal layer 3 on the package surface is of a hollow-square-shaped structure, including an inner circle, an outer circle, and a glue collection groove 301 formed between the inner circle and the outer circle.

In S4, a solder mask layer 4 is prepared between the electrode region and the heat dissipation region on the back surface of the structure III to obtain a structure IV, as shown in FIG. 6.

In this step, the solder mask layer 4 and a preparation process thereof are known to those skilled in the art, and will not be elaborated herein.

Figure 7:
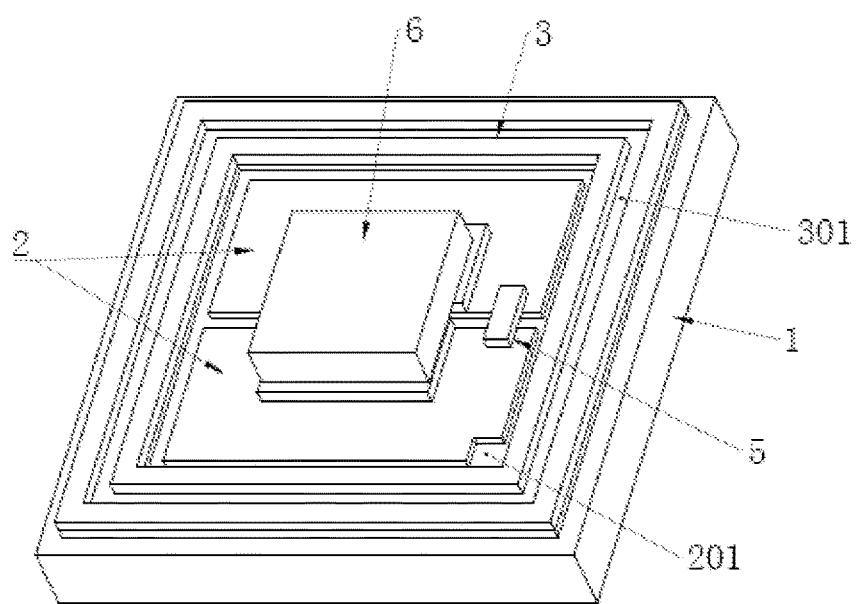
FIG. 7 is a schematic structural diagram of a structure V according to the disclosure.
Figure 8:
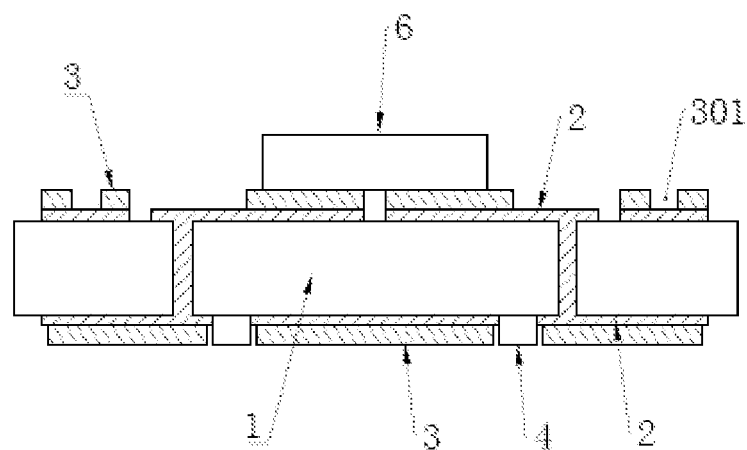
FIG. 8 is a schematic sectional structural diagram of a structure V according to the disclosure.
Figure 9:
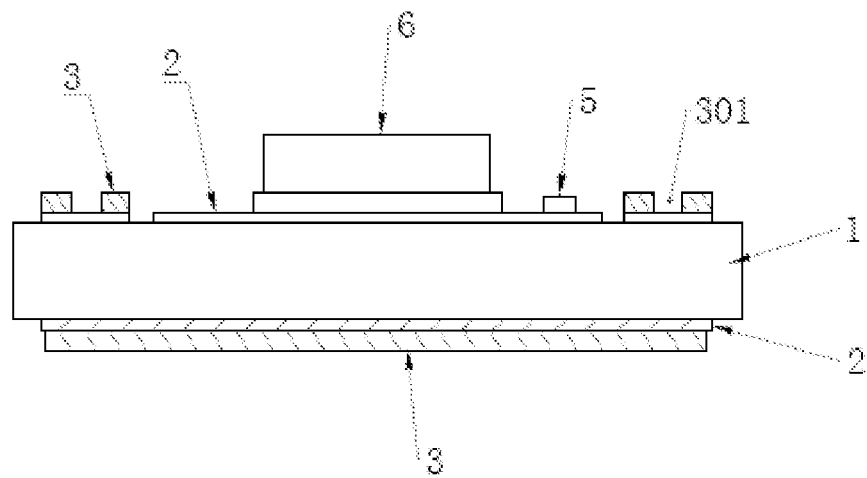
FIG. 9 is another schematic sectional structural diagram of a structure V according to the disclosure.

In S5, a Zener chip 5 is fixedly connected to the electrode region of the first metal layer 2 on the package surface to connect P electrode regions and N electrode regions of the first metal layers 2 respectively, a UVC chip 6 is fixedly connected to an electrode region of the second metal layer 3 on the package surface to connect P electrode regions and N electrode regions of the second metal layers 3 respectively to obtain a structure V, as shown in FIGS. 7 to 9.

In this step, the Zener chip 5 is disposed on the electrode region of the first metal layer 2 on the package surface, the UVC chip 6 is disposed on the electrode region of the second metal layer 3 on the package surface, then eutectic welding of the chips on the metal layers is performed by a AuSn alloy welding process to implement fixation of the chips on the metal layers, and positive and negative electrodes of the chips are connected with P electrode regions and N electrode regions of the metal layers respectively. In the structure V, the Zener chip 5 is connected in parallel with the UVC chip 6.

Figure 10:
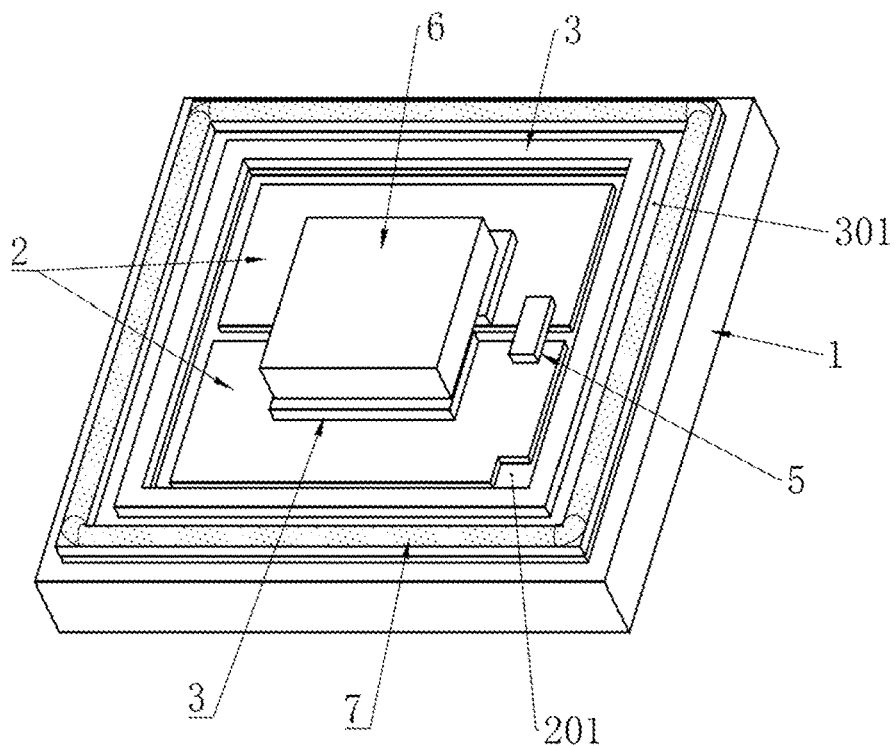
FIG. 10 is a schematic structural diagram of a structure VI according to the disclosure.
Figure 12:
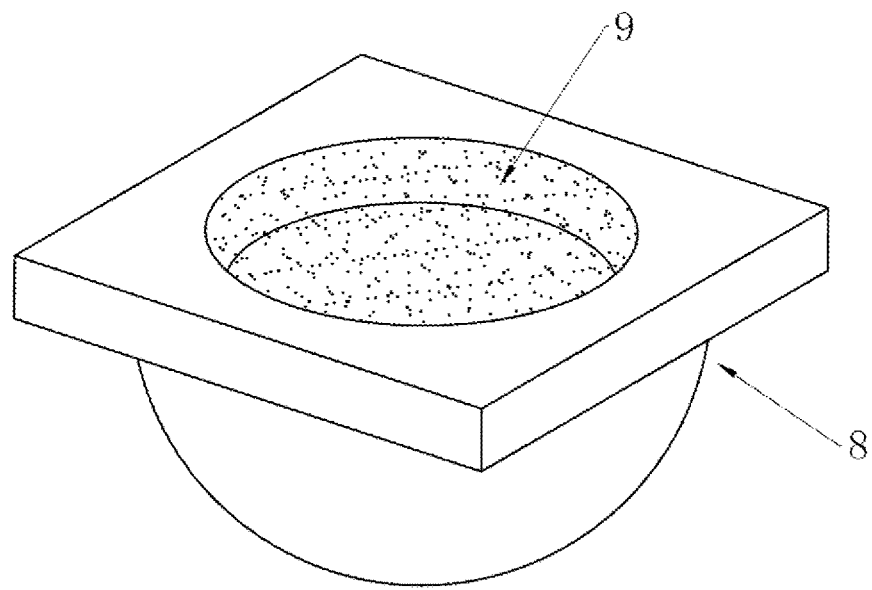
FIG. 12 is a schematic structural diagram of a structure VII according to the disclosure.

In S6, a peripheral region of the second metal layer 3 is coated with a glue solution 7 and preliminarily semi-curing of the glue solution 7 is performed to obtain a structure VI, as shown in FIG. 10, and simultaneously a quartz lens 8 is provided with an accommodating groove 801 and a filler 9 with anti-UVC characteristic is added into the accommodating groove 801 of the quartz lens 8 to obtain a structure VII, as shown in FIG. 12.

In this step, a top surface of the outer circle of the peripheral region of the second metal layer 3 is coated with a glue solution 7 containing at least one of silicon resin, epoxy resin, polyacrylate, polyamide, and benzocyclobutene, and then the glue solution 7 is preliminarily semi-cured to implement preparation of the structure VI. The quartz lens 8 is disposed with the accommodating groove 801 upward, and then the accommodating groove 801 of the quartz lens 8 is additionally filled with a filler 9 containing at least one of silica gel, epoxy resin, silicone, fluorine resin, a molded glass solution, and an organic glass solution to implement preparation of the structure VII.

Figure 13:
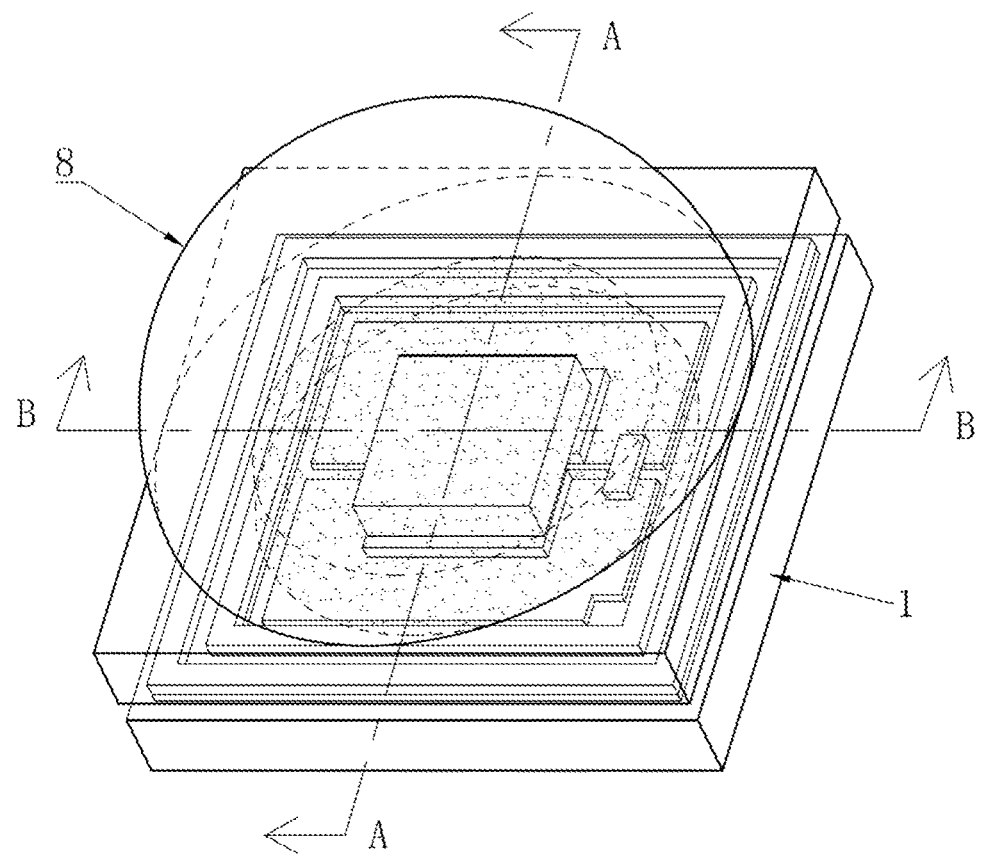
FIG. 13 is a schematic structural diagram of an ultraviolet lamp bead package structure according to embodiment 1 of the disclosure.
Figure 14:
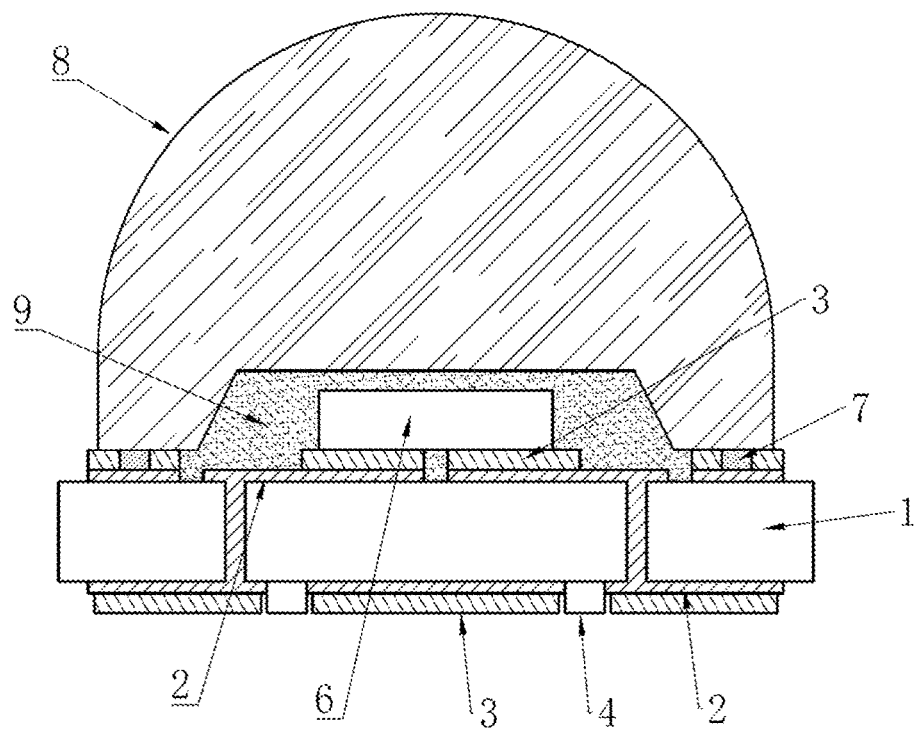
FIG. 14 is a schematic sectional structural diagram along an A-A direction in FIG. 13.
Figure 15:
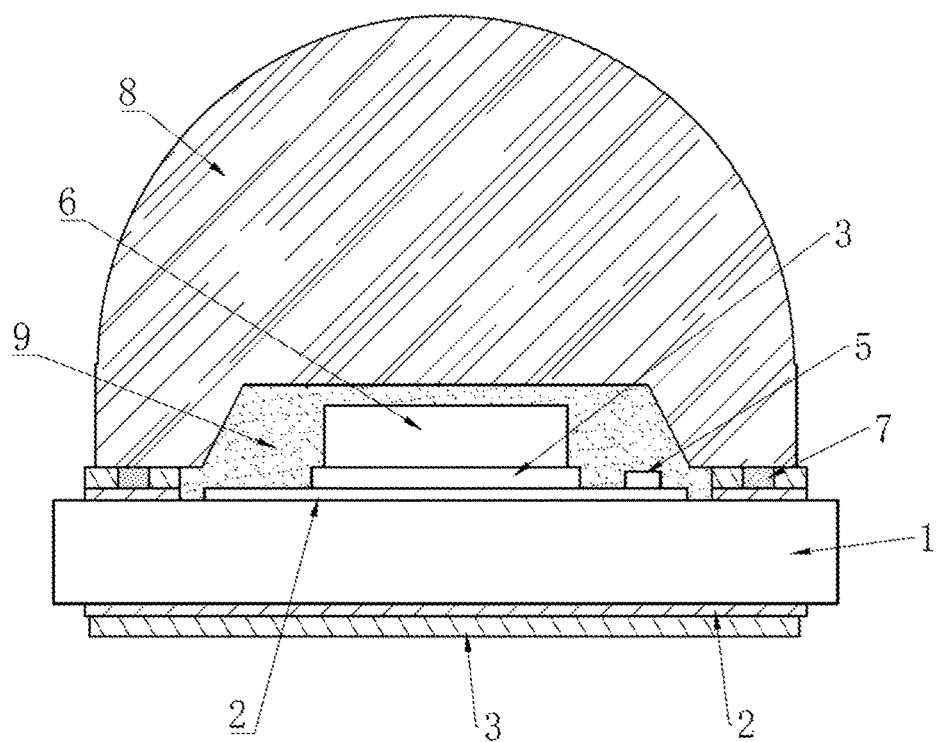
FIG. 15 is a schematic sectional structural diagram along a B-B direction according to the disclosure.

In S7, the structure VI is disposed on the structure VII upside down, and lamination and curing are performed to obtain a final package product, as shown in FIGS. 13 to 15.

In this step, the quartz lens 8 is disposed upside down with a base mounting portion 802 thereof opposite to the peripheral region of the second metal layer 3, and in lamination, the surplus glue solution 7 may spill into the glue collection groove 301 rather than the package structure.

In the present embodiment, the Zener chip 5 connected in parallel with the UVC chip 6 may be replaced with a TVS chip. The Zener chip or the TVS chip connected in parallel with the UVC chip has high electrostatic breakdown resistance and a good over-voltage protection effect.

The ultraviolet lamp bead package structure prepared based on the above-mentioned method has no dam that blocks light of the UVC chip 6, so that light absorption is avoided during work of the package structure, and the light packaging efficiency is improved greatly. In addition, the Zener chip 5 or the TVS chip connected in parallel with the UVC chip 6 implements over-voltage protection without blocking the light of the UVC chip 6, also improves the electrostatic breakdown resistance of the package structure greatly, and prolongs the service life of the UVC chip. Moreover, the package structure uses the high-transmittance quartz lens 8 as a seal, so that the air tightness of a lamp bead is improved, water-oxygen isolation is implemented effectively, and a light shape may be modified. The filler 9 with the anti-UVC characteristic is filled between the quartz lens 8 and each of the UVC chip 6 and the Zener chip 5, whose refractive index is numerically between a light emitting body sapphire (n=1.82) of the chip and the quartz lens (n=1.492), so that the total reflection loss of the light in propagation is reduced, and the light extraction efficiency is improved.

In addition, in the package structure, the positive and negative electrodes of the UVC chip 6 and the Zener chip 5 are transferred to the back surface of the substrate 1, so that surface mounting for use may be implemented, and the ultraviolet lamp bead package structure may be mounted on a solder pad more conveniently, occupied volume is smaller. The heat dissipation region arranged on the back surface of the package structure implements thermoelectric separation, so that a heat dissipation effect of a packaged chip is improved greatly, and the performance and service life of the packaged chip are further improved.

Embodiment 2

The ultraviolet lamp bead package structure of the present embodiment is the same as that in embodiment 1. The difference is that in the present embodiment, the Zener chip 5 is fixedly mounted on the first metal layer 2 by solder paste, and positive and negative electrodes of the Zener chip 5 are connected with the P electrode region and the N electrode region of the first metal layer 2 respectively. The UVC chip 6 is fixedly mounted on the second metal layer 3 by solder paste, and positive and negative electrodes of the UVC chip are connected with the P electrode region and the N electrode region of the second metal layer 3 respectively.

In the present embodiment, the preparation method for the ultraviolet lamp bead package structure is the same as that in embodiment 1. The difference is that in step S5, the Zener chip 5 and the UVC chip 6 are first disposed on the electrode region of the first metal layer 2 and the electrode region of the second metal layer 3 by solder paste respectively, then reflow soldering is performed to implement fixation of the chips on the metal layers, and positive and negative electrodes of the chips are connected with P electrode regions and N electrode regions of the metal layers respectively.

Embodiment 3

The ultraviolet lamp bead package structure of the present embodiment is the same as that in embodiment 1. The difference is that in the present embodiment, the Zener chip 5 is fixedly mounted on the first metal layer 2 by glue with conductive particles, and positive and negative electrodes of the Zener chip 5 are connected with the P electrode region and the N electrode region of the first metal layer 2 respectively. The UVC chip 6 is fixedly mounted on the second metal layer 3 by glue with conductive particles, and positive and negative electrodes of the UVC chip 6 are connected with the P electrode region and the N electrode region of the second metal layer 3 respectively.

In the present embodiment, the preparation method for the ultraviolet lamp bead package structure is the same as that in embodiment 1. The difference is that in step S5, the Zener chip 5 and the UVC chip 6 are first disposed on the electrode region of the first metal layer 2 and the electrode region of the second metal layer 3 by glue with conductive particles respectively, then the glue with the conductive particles is cured to implement fixation of the chips on the metal layers, and positive and negative electrodes of the chips are connected with P electrode regions and N electrode regions of the metal layers by the conductive particles in the glue respectively.

In the present embodiment, the glue with the conductive particles is preferably a conductive silver adhesive.

Embodiment 4

Figure 16:
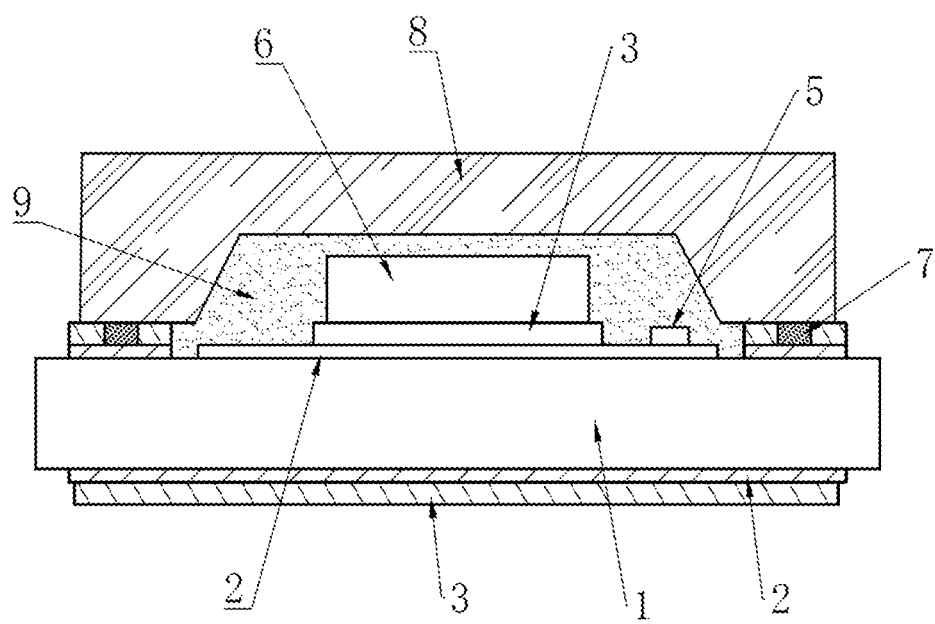
FIG. 16 is a schematic sectional structural diagram of an ultraviolet lamp bead package structure according to embodiment 4 of the disclosure.

As shown in FIG. 16, the ultraviolet lamp bead package structure of the present embodiment is the same as that in embodiment 1. The difference is that in the present embodiment, a top of the quartz lens 8 is of a plane structure.

The above is only the preferred embodiment of the disclosure and not intended to limit the disclosure. Any modifications, equivalent replacements, improvements, and the like made within the spirit and principle of the disclosure shall fall within the scope of protection of the disclosure.

What is claimed is:

1. A method for making an ultraviolet lamp bead package structure,
   wherein the ultraviolet lamp bead package structure comprises:
   a substrate,
   a first metal layer on a package surface and a back surface of the substrate, the package surface and the back surface being opposite, an electrode region of the first metal layer on the package surface and an electrode region of the first metal layer on the back surface being electrically connected by a via through the substrate, and a peripheral region of the first metal layer on the package surface surrounding the electrode region of the first metal layer on the package surface,
   a chip on the electrode region of the first metal layer on the package surface, the chip being a Zener chip or a transient-voltage-suppression (TVS) chip,
   a second metal layer on the first metal layer, an electrode region of the second metal layer being on the electrode region of the first metal layer on the package surface and a peripheral region of the second metal layer being on the peripheral region of the first metal layer on the package surface, a thickness of the electrode region of the second metal layer being greater than or equal to a thickness of the peripheral region of the second metal layer, the thickness of the electrode region of the second metal layer being greater than or equal to a thickness of the chip,
   an ultraviolet C emitter on the electrode region of the second metal layer, and
   a lens hermetically sealed to the peripheral region of the second metal layer and forming a cavity housing the ultraviolet C emitter and the chip therein, and the cavity being filled with a filler;
   wherein the method comprises:
   forming a through hole in the substrate;
   forming the first metal layer by depositing a first metal on the package surface and the back surface and in the through hole;
   forming the second metal layer by depositing a second metal on the first metal layer;
   mounting the chip to the electrode region of the first metal layer, and mounting the ultraviolet C emitter to the electrode region of the second metal layer; and
   mounting the lens to the second metal layer.

2. The method according to claim 1, wherein forming the first metal layer is by photolithography, and evaporation or electroplating.

3. The method according to claim 2, wherein the TVS chip and the UVC emitter are mounted using a AuSn alloy.

4. The method according to claim 1, wherein the lens is hermetically sealed to the peripheral region of the second metal layer by silicon resin, epoxy resin, polyacrylate, polyamide, or benzocyclobutene.

* * * * *